(12) United States Patent
Zigovszki et al.

(10) Patent No.: US 9,671,254 B2
(45) Date of Patent: Jun. 6, 2017

(54) MAGNETIC SENSING TO DETECT TAMPERING WITH A UTILITY METER

(71) Applicant: Mueller International, LLC, Atlanta, GA (US)

(72) Inventors: Szabolcs Zigovszki, Mableton, GA (US); Matt Allen Thomas, Cornelius, NC (US)

(73) Assignee: Mueller International, LLC, Atlanta, GA (US)

( * ) Notice: Subject to any disclaimer, the term of this patent is extended or adjusted under 35 U.S.C. 154(b) by 35 days.

(21) Appl. No.: 14/490,403

(22) Filed: Sep. 18, 2014

(65) Prior Publication Data

US 2016/0084632 A1  Mar. 24, 2016

(51) Int. Cl.

| | | |
|---|---|---|
| G01B 7/004 | (2006.01) | |
| G01D 9/00 | (2006.01) | |
| G01R 11/24 | (2006.01) | |
| G01D 4/00 | (2006.01) | |
| G01D 5/06 | (2006.01) | |

(52) U.S. Cl.
CPC ............ *G01D 9/005* (2013.01); *G01R 11/24* (2013.01); *G01D 4/002* (2013.01); *G01D 5/06* (2013.01); *Y02B 90/241* (2013.01); *Y04S 20/32* (2013.01)

(58) Field of Classification Search
CPC .......... G01B 7/004; G01D 5/12; G01D 9/005; G01R 11/24
USPC ............... 324/207.11–207.26, 244, 260, 156
See application file for complete search history.

(56) References Cited

U.S. PATENT DOCUMENTS

| | | | |
|---|---|---|---|
| 676,656 | A | 6/1901 | Haas |
| 3,045,486 | A | 7/1962 | Thomas et al. |
| 3,067,612 | A | 12/1962 | Smith |
| 3,308,664 | A | 3/1967 | Kullmann |
| 4,663,970 | A | 5/1987 | Sutherland |
| 4,995,643 | A | 2/1991 | Rappart et al. |
| 5,086,292 | A | 2/1992 | Johnson |
| 5,099,348 | A | 3/1992 | Huddleston et al. |
| 5,339,686 | A | 8/1994 | DeJarlais et al. |
| 5,473,322 | A | 12/1995 | Carney |
| 5,631,554 | A | 5/1997 | Briese |

(Continued)

FOREIGN PATENT DOCUMENTS

| | | |
|---|---|---|
| EP | 0359665 | 12/1992 |
| KR | 100959519 | 5/2010 |

OTHER PUBLICATIONS

Cullinan, Thomas; U.S. Patent Application entitled: Solid-State Register Initiated Poll of Status Information having U.S. Appl. No. 14/954,322, filed Nov. 30, 2015, 26 pgs.

(Continued)

*Primary Examiner* — Jay Patidar
(74) *Attorney, Agent, or Firm* — Taylor English Duma LLP

(57) ABSTRACT

Disclosed are systems, methods and apparatuses for detecting tampering with a utility meter. A method may comprise measuring a magnetic field created by a rotating magnet in the meter by a removal detector sensor in a solid-state register (SSR). In addition, the SSR may be configured to detect when the SSR is dislodged or removed from the utility meter. The sensor may comprise a register removal tamper alert. The tamper detection methods described herein provide improved techniques for preventing and deterring attempts to alter meters and steal utility-provided resources.

20 Claims, 4 Drawing Sheets

(56) References Cited

U.S. PATENT DOCUMENTS

| | | | |
|---|---|---|---|
| 5,706,273 | A | 1/1998 | Guerreri |
| 5,910,653 | A | 6/1999 | Campo |
| 6,588,447 | B1 | 7/2003 | Hendey |
| 6,774,807 | B1 | 8/2004 | Lehfeldt |
| 7,007,558 | B1 | 3/2006 | Carpenter |
| 7,565,255 | B2 | 7/2009 | Kanke et al. |
| 8,344,881 | B1 | 1/2013 | Hays |
| 9,476,740 | B2 | 10/2016 | Zigovszki |
| 2002/0126157 | A1 | 9/2002 | Farago et al. |
| 2002/0193144 | A1 | 12/2002 | Belski et al. |
| 2003/0193405 | A1 | 10/2003 | Hunt et al. |
| 2004/0021568 | A1 | 2/2004 | Seal et al. |
| 2005/0066746 | A1 | 3/2005 | Winter |
| 2007/0229256 | A1 | 10/2007 | Seal et al. |
| 2007/0241930 | A1 | 10/2007 | Qureshi et al. |
| 2010/0321205 | A1 | 12/2010 | Olson et al. |
| 2011/0115643 | A1* | 5/2011 | Gilbert .............. G01D 4/008 340/870.09 |
| 2012/0074927 | A1 | 3/2012 | Ramirez |
| 2013/0088353 | A1 | 4/2013 | LaFrance |
| 2013/0113631 | A1 | 5/2013 | Pitchford |
| 2013/0257630 | A1 | 10/2013 | Brennan et al. |
| 2014/0028465 | A1 | 1/2014 | Cornwall |
| 2014/0281624 | A1 | 9/2014 | Cahill-O'Brien et al. |
| 2014/0282550 | A1 | 9/2014 | Blumenfeld et al. |
| 2014/0361908 | A1 | 12/2014 | Laird et al. |

OTHER PUBLICATIONS

Zigovszki, Szabolcs; International Search Report and Written Opinion for serial No. PCT/US15/44156, filed Aug. 7, 2015, mailed Nov. 6, 2015, 9 pgs.

Zigovszki, Szabolcs; International Search Report and Written Opinion for serial No. PCT/US15/50080, filed Sep. 15, 2015, mailed Dec. 10, 2015, 8 pgs.

Zigovszki, Szabolcs; International Search Report and Written Opinion for serial No. PCT/US15/44147, filed Aug. 7, 2015, mailed Nov. 6, 2015, 8 pgs.

Martin, Cole; International Search Report and Written Opinion for Application No. PCT/US15/44154, filed Aug. 7, 2015, mailed Dec. 31, 2015, 12 pgs.

Xigovszki, Szabolcs; U.S. Patent Application entitled: Real-Time Flow Compensation in Usage Accumulation, U.S. Appl. No. 14/490,375, filed Sep. 18, 2014, 28 pgs.

Zigovszki, Szabolcs; U.S. Patent Application entitled: Mode Activation Using Light Detection, U.S. Appl. No. 14/490,381, filed Sep. 18, 2014, 31 pgs.

Zigovszki, Szabolcs; U.S. Patent Application entitled: Reverse Flow Detection and Annunciation, U.S. Appl. No. 14/490,412, filed Sep. 18, 2014; 26 pgs.

Cole, Martin; U.S. Patent Application Entitled: Adjustable Meter With Tamper Detection, U.S. Appl. No. 14/490,095, filed Sep. 18, 2014; 36 pgs.

Zigovszki, Szabolcs; PCT Application entitled: Real-Time Flow Compensation in Usage Accumulcation having serial No. PCT/US15/44156, filed Aug. 7, 2015, 26 pgs.

Zigovszki, Szabolcs; PCT Application entitled: Tamper Detection Through Magnetic Sensing having serial No. PCT/US15/50080, filed Sep. 15, 2015, 26 pgs.

Zigovszki, Szabolcs; PCT Application entitled: Reverse Flow Detection and Annunication having serial No. PCT/US15/44147, filed Aug. 7, 2015, 24 pgs.

Martin, Cole; PCT Application entitled: Adjustable Meter With Tamper Detection having serial No. PCT/US15/44154, field Aug. 7, 2015, 35 pgs.

Zigovszki, Szabolcs; Non-Final Office Action for U.S. Appl. No. 14/490,381, filed Sep. 18, 2014, mailed Jul. 13, 2016, 28 pgs.

Zigovszki, Szabolcs; Corrected Notice of Allowability for U.S. Appl. No. 14/490,412, filed Sep. 18, 2014, mailed Aug. 3, 2016, 4 pgs.

Zigovszki, Szabolcs; Notice of Allowance for U.S. Appl. No. 14/490,412, filed Sep. 18, 2014, mailed Jul. 11, 2016, 9 pgs.

Cole, Martin; Applicant Initiated Interview Summary for U.S. Appl. No. 14/490,095, filed Sep. 18, 2014, mailed Jul. 6, 2016, 3 pgs.

Cole, Martin; Non-Final Office Action for U.S. Appl. No. 14/490,095, filed Sep. 18, 2014, mailed Jun. 15, 2016, 24 pgs.

Zigovszki, Szabolcs; Non-Final Office Action for U.S. Appl. No. 14/490,412, filed Sep. 18, 2014, mailed Apr. 1, 2016, 21 pgs.

Zigovski, Szabolcs; Corrected Notice of Allowability for U.S. Appl. No. 14/490,412, filed Sep. 18, 2014, mailed Sep. 20, 2016, 7 pgs.

Zigovski, Szabolcs; Issue Notification for U.S. Appl. No. 14/490,412, filed Sep. 18, 2014, mailed Oct. 5, 2016, 1 pg.

Cole, Martin; Final Office Action for U.S. Appl. No. 14/490,095, filed Sep. 18, 2014; mailed Oct. 6, 2016; 16 pgs.

Cullinan, Thomas; Non-Final Office Action for U.S. Appl. No. 14/954,322, filed Nov. 30, 2015, mailed Nov. 2, 2016; 37 pgs.

Zigovszki, Szabolcs; Final Office Action for U.S. Application No. 14/490,381, filed Sep. 18, 2014, mailed 1/3112017, 26 pgs.

Cole, Martin; Notice of Allowance for U.S. Patent Application No. 14/490,095, filed Sep. 18, 2014, mailed Jan. 13, 2017, 13 pgs.

Zigovszki, Szabolcs; International Preliminary Report on Patentability for Application No. PCT/US15/44156, filed Mar. 7, 2015, mailed Mar. 30, 2017, 8 pgs.

Zigovszki, Szabolcs; International Preliminary Report on Patentability for Application No. PCT/US15/50080, filed 3115/2015, mailed Mar. 30, 2017, 7 pgs.

Zigovszki, Szabolcs; International Preliminary Report on Patentability for Application No. PCT/US15/44147, filed Mar. 7, 2015, mailed Mar. 30, 2017, 7 pgs.

Martin, Cole; International Preliminary Report on Patentability for Application No. PCT/US15/44154, filed Aug. 7, 2015, mailed Mar. 30, 2017, 9 pgs.

Cullinan,Thomas; Final Office Action for Application no. 141954,322, filed Nov. 30, 2015, mailed Apr. 10, 2017, 29 pgs.

Zigovszki,Szaboles; Non-final Office Action for U.S. Application No. 141490,375, filed Sep. 18, 2014, mailed 4124/2017, 17 pgs.

* cited by examiner

MAGNETIC SENSING TO DETECT TAMPERING WITH A UTILITY METER

BACKGROUND

Conventional water, gas, or other utility meters normally include a mechanical register for accumulating and displaying usage data for customers and utility provider personnel (e.g. meter readers). A typical register may include odometer-style wheels and/or dials that collectively record the total volume of product used. These registers may be driven by a mechanical or magnetic coupling with a measuring element inside of a measuring chamber of the meter. Gears in the register convert the motion of the measuring element to the proper usage increment for display on the dials and/or wheels. The mechanical register may further include a means of converting the current position of the dials and wheels to an electronic signal for sending the current usage data electronically to automatic meter reading ("AMR") or advanced metering infrastructure ("AMI") systems for remote reading and/or monitoring of the metered consumption.

As an alternative to mechanical registers, a solid-state register ("SSR") may be utilized in meters by a utility provider. SSRs are totally electronic with no mechanical gearing or moving parts and may interface magnetically with the measuring element inside of the measuring chamber of the meter. The SSR uses electronics and firmware programming to detect flow, accumulate usage, and display usage on an LCD or other electronic display. Other operational metrics beyond usage may also be determined and/or displayed, such as average flow rate, instant flow rate, reverse flow, and the like. The programmatic nature of the SSR may allow a single model of register to be programmed with the appropriate parameters and scaling factors to work with a variety of meters and provide higher consumption resolution and accuracy than mechanical odometer registers. SSRs may also provide for the implementation of additional features not available in traditional mechanical registers, such as accumulation, display, and reporting of operational metrics beyond usage, alarming capability via AMR/AMI systems for tamper conditions and reverse flow, and the like.

It is with respect to these and other considerations that the disclosure made herein is presented.

BRIEF SUMMARY

The present disclosure relates to technologies for detecting tampering through magnetic sensing. According to some embodiments, a method of detecting tampering with a meter comprises measuring a magnetic field created by a rotating magnet in the meter and determining whether the magnetic field is below a removal threshold. Upon determining that the magnetic field is below the removal threshold, a register removal tamper alert is provided.

According to further embodiments, a solid-state register comprises a removal detector configured to measure a magnetic field created by a rotating magnet in a meter. A microcontroller is connected to the removal detector. The microcontroller is configured to determine whether the magnetic field is below a removal threshold. Upon determining that the magnetic field is below the removal threshold, the microcontroller is configured to provide a register removal tamper alert.

According to further embodiments, a system comprises a measuring chamber of a meter assembly, the measuring chamber including a rotating magnet, and a solid-state register implemented in the meter assembly. The solid-state register comprises a removal detector positioned proximate to the rotating magnet. The removal detector is configured to measure a magnetic field created by the rotating magnet. The solid-state register further comprises a microcontroller connected to the removal detector. The microcontroller is configured to determine whether the magnetic field is below a removal threshold and, upon determining that the magnetic field is below the removal threshold, provide a register removal tamper alert.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

The following detailed description is directed to technologies for using magnetic sensing to detect tampering with a utility meter. Using the technologies described herein, a solid-state register ("SSR") may be configured to detect when an external magnet is used to create a strong external magnetic field that interferes with the normal operation of the utility meter. In addition, the SSR may be configured to detect when the SSR is dislodging or removed from the utility meter. The tamper detection methods described herein provide improved techniques for preventing and deterring attempts to alter meters and steal utility-provided resources.

Figure 1:
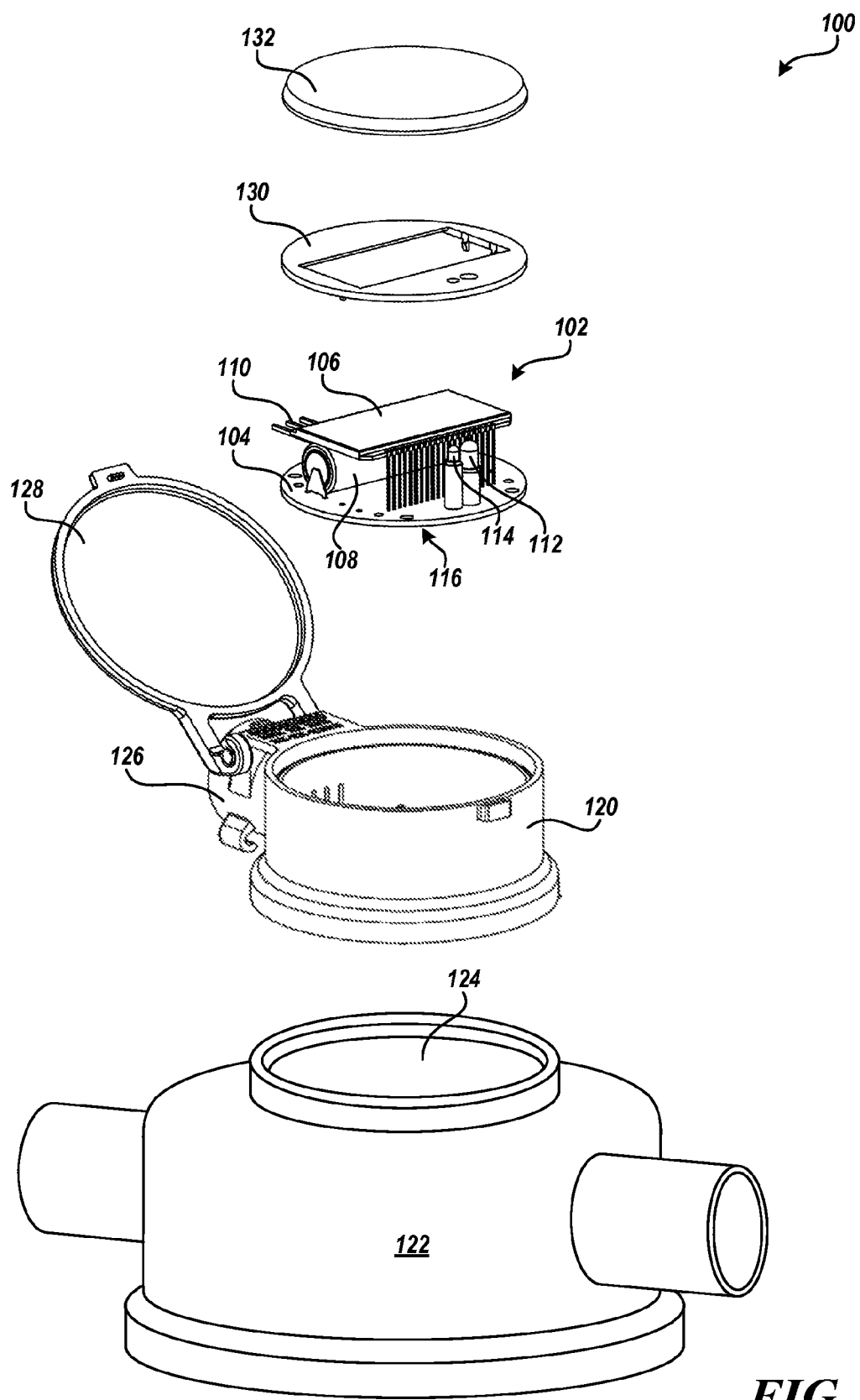
FIG. 1 is a perspective view showing an assembly of an illustrative water meter including a solid-state register, according to embodiments described herein.

FIG. 1 is a perspective view showing an assembly of an illustrative water meter 100, including a solid-state register 102. According to embodiments, the SSR 102 comprises a printed circuit board ("PCB") 104 upon which various components are attached. In some embodiments, the SSR 102 may include a liquid crystal display ("LCD") 106 or other electronic display connected to the PCB 104. The LCD 106 may display the accumulated usage data to a local observer, such as a customer, installer, meter reader, or other utility provider personnel. The LCD 106 may also display other operational parameter information, such as flow rates, meter ID, model number of the meter 100 and/or SSR 102, test mode accumulation, error codes, and the like, as well as indicate status information for the meter, such as units of measurement displayed, error condition, flow direction, current operation mode, battery condition, and the like.

The SSR 102 may further include a battery 108 for powering the operation of the electronic components of the SSR. In some embodiments, the power requirements of the SSR 102 may allow the battery 108 to power the SSR for an extended period of time in normal operation, such as 20 years. The SSR 102 may also include an interface connector 110 for electronically connecting the SSR to an external device, such as an AMR/AMI communication device, a portable programming device, or the like. In some embodiments, the interface connector 110 may comprise a three-wire connector. The SSR 102 may also include an optical sensor 112 or photo-detector. The optical sensor 112 may allow the SSR 102 to detect light conditions within the meter 100 in order to determine the correct mode for operation. The optical sensor 112 may also serve as an infrared ("IR") detector. The SSR 102 may further include an IR emitter 114, which together with the optical sensor 112, provides an IR port for the SSR to communicate with external devices, such as portable programming devices and the like.

The SSR 102 may be shaped and sized to be inserted into an enclosure 120. The enclosure may be mechanically configured to be attached to the measuring chamber 122 of the meter 100, such that a bottom surface 116 of the PCB 104 is within a defined distance of a top surface 124 of the measuring chamber. The bottom surface 116 of the PCB 104 may hold flow sensors and other detection devices that interface with a magnetic measuring element within the measuring chamber. The SSR 102 and the enclosure 120 may be configured to be compatible with a variety of measuring chambers 122 for a variety of models and types of water meters 100.

Once positioned in the enclosure 120, the SSR 102 may be covered by a faceplate 130 and lens 132. The faceplate may include openings for the LCD 106, the optical sensor 112, and the IR emitter 114. The lens 132 may be sealed to the enclosure 120 in order to protect the SSR 102 from external contaminants. The enclosure 120 may further include a recess 126 through which the interface connector 110 may extend allowing the SSR 102 to be connected to the external devices. The enclosure 120 may also include a cover 128 or lid which may be closed over the SSR 102 in order to protect the lens 132 as well as isolate the optical sensor from light 112.

Figure 2:
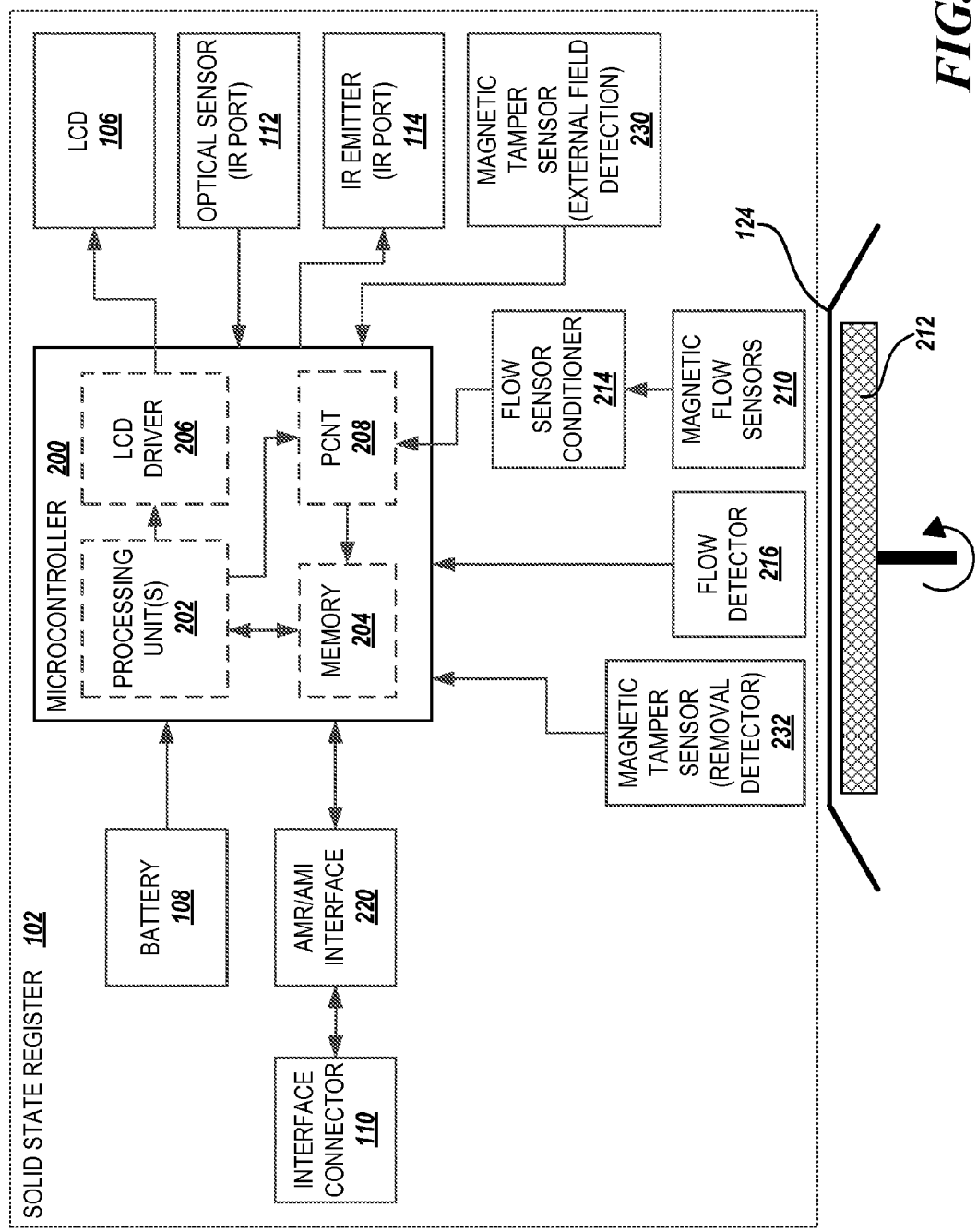
FIG. 2 is a block diagram of an illustrative solid-state register capable of executing the software components described herein for detecting tampering through magnetic sensing, according to embodiments described herein.

FIG. 2 shows a block diagram of the SSR 102, according to some embodiments. The SSR 102 includes a microcontroller 200 for performing the functions of the SSR as described herein. The microcontroller 200 may be a microcontroller unit ("MCU") designed for smart meter applications, such as the MC9S08GW64 from Freescale Semiconductor of Austin, Tex. The microcontroller 200 contains a variety of modules in a single, integrated circuit, including one or more processing units 202. The processing unit(s) 202 represent standard programmable processors that perform arithmetic and logical operations necessary for the operation of the SSR 102. The processing unit(s) 202 perform the necessary operations by transitioning from one discrete, physical state to the next through the manipulation of switching elements that differentiate between and change these states. Switching elements may generally include electronic circuits that maintain one of two binary states, such as flip-flops, and electronic circuits that provide an output state based on the logical combination of the states of one or more other switching elements, such as logic gates. These basic switching elements may be combined to create more complex logic circuits, including registers, adders-subtractors, arithmetic logic units, floating-point units, or the like.

The microcontroller 200 further includes a memory 204. The memory 204 may comprise a computer-readable storage medium for storing processor-executable instructions, data structures and other information. The memory 204 may include a non-volatile memory, such as read-only memory ("ROM") and/or FLASH memory, and a random-access memory ("RAM"), such as dynamic random access memory ("DRAM") or synchronous dynamic random access memory ("SDRAM"). The memory 204 may store a firmware that comprises instructions, commands and data necessary for operation of the SSR 102. According to some embodiments, the memory 204 may store processor-executable instructions that, when executed by the processing units 202, perform the methods 300 and 400 for detecting tampering by an external magnetic field and for detecting tampering by removal of an solid-state register, as described herein.

In addition to the memory 204, the microcontroller 200 may have access to other computer-readable media storing program modules, data structures, and other data described herein for detecting tampering through magnetic sensing. It will be appreciated by those skilled in the art that computer-readable media can be any available media that may be accessed by the microcontroller 202 or other computing system, including computer-readable storage media and communications media. Communications media includes transitory signals. Computer-readable storage media includes volatile and non-volatile, removable and non-removable storage media implemented in any method or technology for the non-transitory storage of information. For example, computer-readable storage media includes, but is not limited to, RAM, ROM, erasable programmable ROM ("EPROM"), electrically-erasable programmable ROM ("EEPROM"), FLASH memory or other solid-state memory technology, compact disc ROM ("CD-ROM"), digital versatile disk ("DVD"), high definition DVD ("HD-DVD"), BLU-RAY or other optical storage, magnetic cassettes, magnetic tape, magnetic disk storage or other magnetic storage devices and the like.

The microcontroller 200 may further include an integrated LCD driver 206 for driving the LCD 106 or other electronic display to display accumulated usage information, operations parameters, error codes, status information, and the like. In some embodiments, the LCD 106 may comprise an LCD panel specifically designed for utility meter applications, such as the W527110 panel from Truly Semiconductors Ltd. of Kwai Chung, Hong Kong. The microcontroller 200 may also include and integrate a pulse counter unit 208, also referred to as a position counter ("PCNT"). The pulse counter unit 208 is a low power pulse sequence counter that receives one or more input signals, or "pulses," from magnetic flow sensors 210. The magnetic flow sensor 210 may represent rotational sensors that sense the rotation of the measurement device, such as a rotating magnet 212, contained in the measurement chamber 122 of the meter 100 and provide signals or "pulses" to the pulse counter unit 208 that allow the unit to accumulate a pulse count representing a volume of water, gas, electricity, or other product flowing through the meter 100.

In some embodiments, the magnetic flow sensors 210 may comprise a tunneling magnetoresistance ("TMR") angle sensor, such as the NVE AAT001-10E from NVE Corporation of Eden Prairie Minn. The TMR sensor may provide rotational position measurements in a rotating magnetic field that provides the necessary pulse sequences to the pulse counter unit 208 to determine both the flow direction and quantity of the flow. The magnetic flow sensors 210 may be mounted on the bottom surface 116 of the PCB 104 such that it is in proximity of the magnetic field created by the rotating magnet 212 through the top surface 124 of the measurement chamber 122. According to some embodiments, the signals from the magnetic flow sensors 210 may be pre-processed by a flow sensor conditioner 214 before be provided to the pulse counter unit 208. For example the signals from the magnetic flow sensors 210 may pass through a dual push-pull comparator, such as the Microchip MCP6542 from Microchip Technology Inc. of Chandler, Ariz.

The pulse counter unit 208 may be configured to operate in two-signal gray mode (also referred to as quadrature mode) to detect and accumulate pulse counts for both forward and reverse flows. Once configured by the firmware, the pulse counter unit 208 may run independently of the processing units as long as flow is detected in the meter 100. According to some embodiments, the pulse counter unit 208 may maintain two distinct registers in the microcontroller's memory 204 or processing unit(s) 202, one forward flow counter and one reverse flow counter.

According to some embodiments, the SSR 102 further includes a flow detector 216. The flow detector 216 may comprise a reed switch or other sensor that detects a change in the magnetic field from the rotating magnet 212 and signals the microcontroller 200 to provide power to the magnetic flow sensors 210 and/or pulse counting unit 208. In this way, the SSR 102 may operate in an extremely low power mode when no flow is detected to preserve the life of the battery 108. As with the magnetic flow sensors 210, the flow detector 216 may be mounted on the bottom surface 116 of the PCB 104 such that it is in proximity of the magnetic field created by the rotating magnet 212 through the top surface 124 of the measurement chamber 122.

The microcontroller 200 may further connect with other components of the SSR 102 through a variety of interfaces of the microcontroller. For example, the microcontroller 200 interfaces with the optical sensor 112 described above in order to detect changes in external light conditions in order to switch the SSR 102 to the appropriate mode of operation. In some embodiments, the optical sensor 112 may comprise a phototransistor, such as the PT333-3C from Everlight Electronics Co., Ltd. of New Taipei City, Taiwan. In further embodiments, the microcontroller 200 may further utilize interfaces with the optical sensor 112 and the IR emitter 114 in order to provide an IR port for two-way communication with external devices, for configuration of the SSR 102, updating of the firmware, and the like.

The microcontroller 200 may further include an AMR/AMI interface 220 for communicating with an external device through the interface connector 110, such as an AMR/AMI communication device, a portable programming device, or the like. The AMR/AMI interface 220 may provide for receiving and responding to interrogatories and commands from the external device, such as a request for accumulated usage data or current status information regarding the SSR. The AMR/AMI interface 220 may further allow the microcontroller 200 to initiate communication with the external device, according to further embodiments. In some embodiments, the AMR/AMI interface 220 may utilize a universal asynchronous receiver/transmitter ("UART") module integrated in the microcontroller 200 to provide a 3-wire serial interface with the external device.

In some embodiments, the SSR 102 may include a number of magnetic tamper sensors 230, 232 that interface with the microcontroller 200. For example, an external field detection sensor 230 may interface with the microcontroller 200 and provide a signal when the SSR 102 is subject to an external magnetic field. The external field detection sensor 230 may be used to detect the presence of a strong external magnetic field, indicating an attempt to tamper with the normal sensing of the magnetic field of the rotating magnet 212 by the magnetic flow sensors 210. The external field detection sensor 230 may comprise a digital output magnetic sensor, such as the TCS20DPR from Toshiba of Tokyo, Japan, that may provide an indication of the relative strength of the detected magnetic field. In various embodiments, the external field detection sensor 230 may provide a signal indicating if the detected magnetic field exceeds a threshold magnetic field or a threshold magnetic flux density, potentially indicating a tampering with the SSR 102 or water meter 100 through the use of one or more external magnets.

Additionally or alternatively, a removal detector 232 may interface with the microcontroller 200 and provide a signal indicating if the detector is removed from the magnetic field of the rotating magnet 212, indicating that the SSR 102 may have been dislodged or removed from the measurement chamber 122 of the meter 100. In some embodiments, the removal detector 232 may comprise a three-axis digital magnetometer, such as the MAG3110 from Freescale Semiconductor. As with the magnetic flow sensors 210 and the flow detector 216, the removal detector 232 may be mounted on the bottom surface 116 of the PCB 104 such that it is in proximity of the magnetic field created by the rotating magnet 212 through the top surface 124 of the measurement chamber 122.

It will be appreciated that the structure and/or functionality of the SSR 102 may be different than that illustrated in FIG. 2 and described herein. For example, while the processing units 202, memory 204, LCD driver 206, and pulse counter unit 208 are shown as modules integrated into the microcontroller 200, these components may represent discrete circuitry or components, or may be distributed among multiple integrated circuit packages. Similarly, the microcontroller 200, the flow sensor conditioner 214, the AMR/AMI interface 220 and other components of the SSR 102 not described may be integrated within a common integrated circuit package or distributed among multiple integrated circuit packages. The illustrated connection pathways are provided for purposes of illustration and not of limitation, and some components and/or interconnections may be omitted for purposes of clarity. It will be further appreciated that the SSR 102 may not include all of the components shown in FIG. 2, may include other components that are not explicitly shown in FIG. 2 or may utilize an architecture completely different than that shown in FIG. 2.

Figure 3:
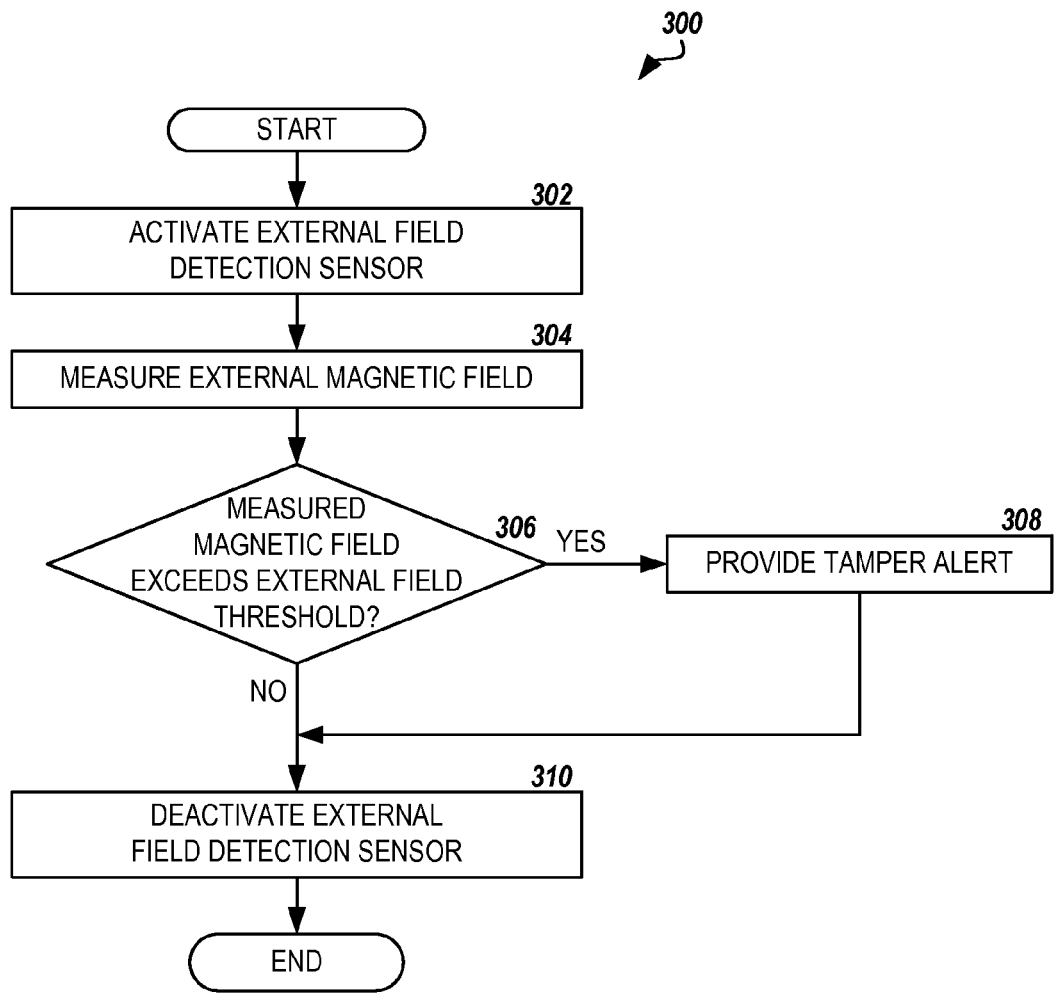
FIG. 3 is a flow diagram showing one method for detecting tampering by detecting the application of an external magnetic field, according to embodiments described herein.

FIG. 3 is a flow diagram showing one method 300 for detecting tampering by an external magnetic field, according to some embodiments. The method 300 begins at step 302, where the external field detection sensor 230 is activated. For example, the microcontroller 200 may provide power to the external field detection sensor 230 to transition the external field detection sensor 230 from a rest phase to a detection phase. During the rest phase, the external field detection sensor 230 may consume no power or low power to reduce power consumption. To conserve power consumption, the external field detection sensor 230 may be activated at regular intervals or at one or more predetermined times. In some embodiments, the external field detection sensor 230 may be activated every 5 minutes.

Next, the method 300 proceeds from step 302 to step 304, where the external magnetic field is measured. For example, the external field detection sensor 230 may measure a magnetic flux density using one or more sensing elements, such as silicon hall elements. According to some embodiments, as an external magnet is moved towards the external field detection sensor 230, the magnetic field of the external magnet is measured by the external field detection sensor 230. In certain embodiments, the measured magnetic flux density may be offset to cancel or correct for various factors, such as temperature, interference, or noise, such as from other electronic components.

From step 304, the method 300 proceeds to step 306, where it is determined whether the measured magnetic field exceeds an external field threshold. The external field threshold may be a magnitude or unit of measurement of a magnetic field, magnetic flux, or magnetic flux density indicative of tampering with an external magnet. In certain embodiments, the external field threshold may be 5,000 gauss. In some embodiments, the external field detection sensor 230 may comprise a comparator that compares the measured magnetic flux density with an external field threshold magnetic flux density and provides an output to the microcontroller 200 indicating if the measured magnetic flux density exceeds the external field threshold magnetic flux density. The output of the external field detection sensor 230 may be a binary output, flag, or the like. In some embodiments, the external field detection sensor 230 may provide an output to the microcontroller 200 indicating the relative strength of the measured magnetic field and the microcontroller 200 may determine whether the measured magnetic field exceeds the external field threshold configured in the microprocessor.

If the measured magnetic field is determined not to exceed the external field threshold, the method 300 proceeds from step 306 to step 310 where the external field detection sensor 230 is deactivated. For example, the microcontroller 200 may reduce or cut-off power to the external field detection sensor 230 to transition the external field detection sensor 230 from a detection phase to a rest phase. In some embodiments, the detection phase of the external field detection sensor 230 may last 1 millisecond.

If the measured magnetic field is determined to exceed the external field threshold, the method 300 proceeds from step 306 to step 308 where a tamper alert is provided. For example, the microcontroller 200 may provide a signal to the LCD 106 to display an error message. The error message may comprise a code, icon, light, text, numbers, or the like. In some embodiments, the error message may comprise a code that is displayed on a numeric section of the LCD 106. The code may include text, such as "Err," and/or a number, such as "001." The number may indicate a particular error. For example, the code "Err001" may indicate that an external magnetic tamper is detected. A different code, such as "Err008," may indicate that a register removal tamper is detected, as described in further detail below. In certain embodiments, the LCD 106 alternately displays any error messages and consumption information. For instance, when activated, the LCD 106 may display an error message for 1 second followed by consumption information for 3 seconds. Such a pattern may be repeated while the LCD 106 is active.

In addition or alternatively, in some embodiments of step 308, providing a tamper alert includes the microcontroller 200 providing a signal to the AMR/AMI interface 220 to include an error flag in an AMR message. For example, the AMR message may comprise one or more status flags wherein a value (such as 1) indicates that an error or status is present (or has been present) and a different value (such as 0) indicates that no error or status is present (or has been present). In some embodiments, the AMR message comprises a plurality of status flags in a set order. For instance, the AMR message may comprise 4 status flags in a set order, wherein a first status flag indicates whether an external magnetic tamper is detected, a second status flag may indicate whether a low battery is detected, a third status flag may indicate whether a back flow is detected, and a fourth status flag may indicate whether a register removal is detected, as described in further detail below. In accordance with such embodiments, providing a tamper alert includes setting the first status flag in the AMR message to a value indicating that an external magnetic tamper is detected.

Either simultaneously with, before, or after providing a tamper alert at step 308, the method 300 proceeds to step 310 where the external field detection sensor 230 is deactivated as described above.

Figure 4:
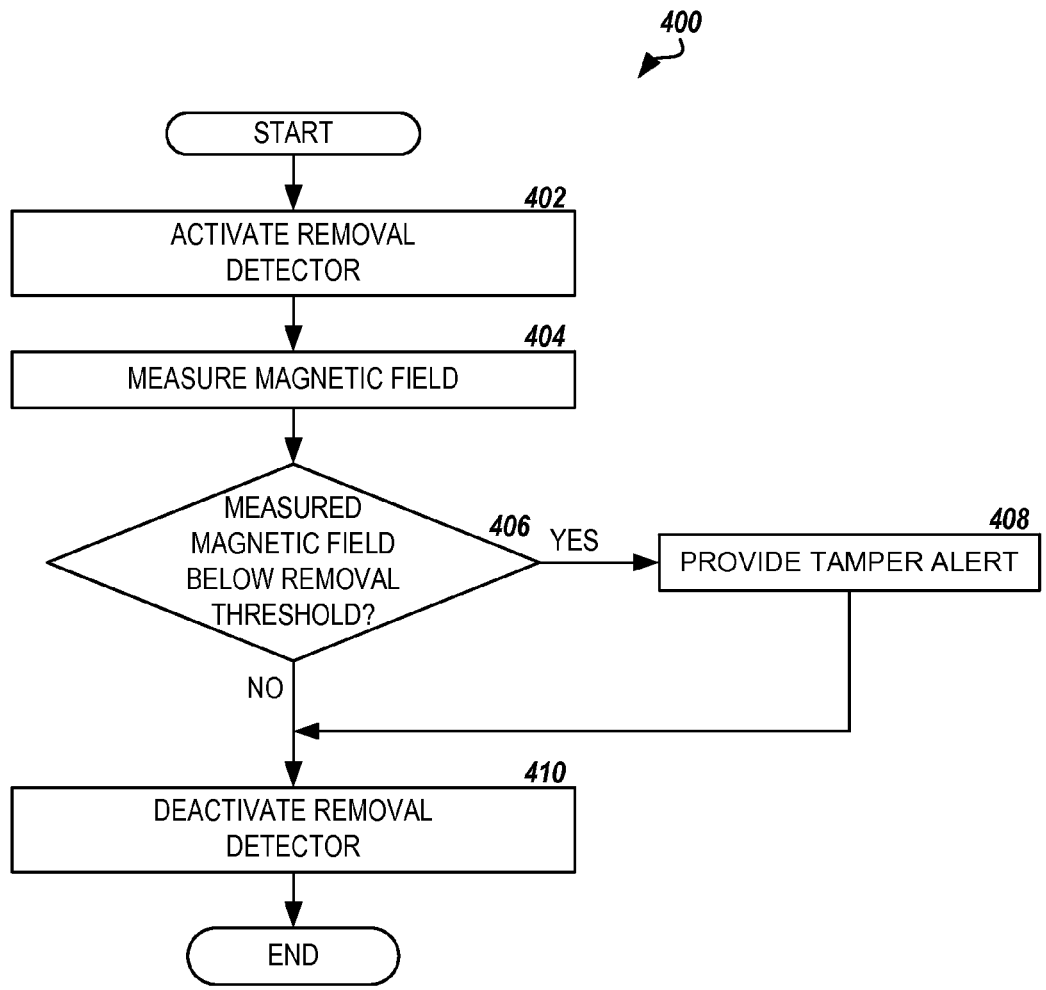
FIG. 4 is a flow diagram showing one method for detecting tampering by detecting removal of a solid-state register from a meter, according to embodiments described herein.

FIG. 4 is a flow diagram showing one method for detecting tampering by removal of the SSR 102 from the meter 100, according to some embodiments. The method 400 begins at step 402, where the removal detector 232 is activated. For example, the microcontroller 200 may provide power to the removal detector 232 to transition the removal detector 232 from a standby mode to a measurement mode. During the standby mode, the removal detector 232 may consume no power or low power to reduce power consumption. To conserve power consumption, the removal detector 232 may be activated at regular intervals or at one or more predetermined times. In some embodiments, the removal detector 232 may be activated every 5 minutes.

Next, the method 400 proceeds from step 402 to step 404, where the magnetic field is measured. As described above, the removal detector 232 may be mounted on the bottom surface 116 of the PCB 104 such that it is in proximity of the magnetic field created by the rotating magnet 212 through the top surface 124 of the measurement chamber 122. For example, the removal detector 232 may measure the magnetic field using one or more sensing elements, such as a magnetic transducer. According to some embodiments, the removal detector 232 measures the magnetic field in three axes: an x-axis, a y-axis, and a z-axis. In certain embodiments, the measured magnetic field may be offset to cancel or correct for various factors, such as temperature, interference, or noise, such as from other electronic components.

From step 404, the method 400 proceeds to step 406, where it is determined whether the measured magnetic field is below a removal threshold. The removal threshold may be a magnitude or unit of measurement of a magnetic field, magnetic flux, or magnetic flux density indicative of tampering by removing the removal detector 232 from the magnetic field of the rotating magnet 212, indicating that the SSR 102 may have been dislodged or removed from the measurement chamber 122 of the meter 100. In certain embodiments, the removal threshold may be 5 gauss. In some embodiments, the removal detector 232 may provide an output to the microcontroller indicating the measured magnetic field. For example, the removal detector 232 may comprise an I²C serial interface output having I²C data registers, wherein the microcontroller 200 reads data indicating the measured magnetic field in the x-axis, the y-axis, and the z-axis from the I²C data registers. The microcontroller 200 may compare the measured magnetic field to the removal threshold and determine whether the measured magnetic field is below the removal threshold. For instance, the microcontroller 200 may compare the measured magnetic field in each of the x-axis, the y-axis, and the z-axis to a removal threshold and determine that the measured magnetic field is below the removal threshold if the measured magnetic field in any one of the x-axis, the y-axis, or the z-axis is below the removal threshold. In some embodiments, the microcontroller 200 may determine that the measured magnetic field is below the removal threshold if the measured magnetic field in two or more of the x-axis, the y-axis, or the z-axis are below the removal threshold. In certain embodiments, the removal detector 232 may compare the measured magnetic field to the removal threshold and provide an output to the microcontroller 200 indicating whether the measured magnetic field is below the removal threshold. The output of the removal detector 232 may be a binary output, flag, or the like.

If the measured magnetic field is determined not to be below the removal threshold, the method 400 proceeds from step 406 to step 410 where the removal detector 232 is deactivated. For example, the microcontroller 200 may reduce or cut-off power to the removal detector 232 to transition the external field detection sensor 230 from a measurement mode to a standby mode. In some embodiments, the measurement mode of the removal detector 232 may last 17 milliseconds.

If the measured magnetic field is determined to be below the removal threshold, the method 400 proceeds from step 406 to step 408 where a tamper alert is provided. For example, the microcontroller 200 may provide a signal to the LCD 106 to display an error message. As described above, the error message may comprise a code, icon, light, text, numbers, or the like. In some embodiments, the error message may comprise a code that is displayed on a numeric section of the LCD 106. The code may include text, such as "Err," and/or a number, such as "001." The number may indicate a particular error. For example, the code "Err008" may indicate that register removal tamper is detected. As described above, in certain embodiments, the LCD 106 alternately displays any error messages and consumption information. For instance, when activated the LCD 106 may display an error message for 1 second followed by consumption information for 3 seconds. Such a pattern may be repeated while the LCD 106 is active.

In addition or alternatively, in some embodiments of step 408, providing a tamper alert includes the microcontroller 200 providing a signal to the AMR/AMI interface 220 to include an error flag in an AMR message. As described above, for example, the AMR message may comprise one or more status flags wherein a value (such as 1) indicates that an error or status is present (or has been present) and another value (such as 0) indicates that no error or status is present (or has been present). In some embodiments, the AMR message comprises a plurality of status flags in a set order. For instance, the AMR message may comprise 4 status flags in a set order. As described above, the fourth status flag may indicate whether a register removal tamper is detected. In accordance with such embodiments, providing a tamper alert includes setting the fourth status flag in the AMR message to a value indicating that a register removal tamper is detected.

Either simultaneously with, before, or after providing a tamper alert at step 408, the method 400 proceeds to step 410 where the removal detector 232 is deactivated as described above.

Based on the foregoing, it will be appreciated that technologies for detecting tampering through magnetic sensing are presented herein. While embodiments are described herein in regard to an SSR 102 implemented in a water meter 100, it will be appreciated that technologies described herein may be utilized in any programmable or configurable solid-state or electronic meter that measures the flow of any product. The above-described embodiments are merely possible examples of implementations, set forth for a clear understanding of the principles of the present disclosure.

The logical operations, functions or steps described herein as part of a method, process or routine may be implemented (1) as a sequence of processor-implemented acts, software modules or portions of code running on a controller or computing system and/or (2) as interconnected machine logic circuits or circuit modules within the controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be further appreciated that conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features and aspects discussed above. All such modifications and variations are intended to be included herein within the scope of the present disclosure, and all possible claims to individual aspects or combinations of elements or steps are intended to be supported by the present disclosure.

What is claimed is:

1. A method for detecting tampering with a meter, the method comprising the steps of:

measuring, by a removal detector in a solid-state register, a magnetic field in an x-axis, a y-axis, and a z-axis created by a rotating magnet in the meter, the removal detector comprising a three-axis magnetometer;

determining whether the measured magnetic field is below a removal threshold in at least one of the x-axis, the y-axis, or the z-axis, wherein the measured magnetic field being below the removal threshold indicates removing the removal detector from the magnetic field of the rotating magnet; and upon determining that the magnetic field is below the removal threshold, providing a register removal tamper alert.

2. The method of claim 1, wherein the step of determining whether the magnetic field is below a removal threshold is performed by a microcontroller in the solid-state register.

3. The method of claim 1, wherein providing the register removal tamper alert comprises:

providing, by a microcontroller in the solid-state register, a signal to a display on the solid-state register to display a message indicating a register removal tamper; and displaying, by the display, the message.

4. The method of claim 1 wherein providing the register removal tamper alert comprises:
   providing, by a microcontroller in the solid-state register, a signal to an interface on the solid-state register to include a flag in an automatic meter reading message indicating a register removal tamper; and
   including, by the interface, the flag in the automatic meter reading message.

5. The method of claim 4 wherein providing the register removal tamper alert further comprises:
   providing, by the microcontroller, a signal to a display on the solid-state register to display a message indicating a register removal tamper; and
   displaying, by the display, the message.

6. The method of claim 1, further comprising the steps of:
   measuring, by an external field detection sensor in the register, an external magnetic field created by a magnet external to the meter;
   determining whether the external magnetic field is above an external field threshold; and
   upon determining that the external magnetic field is above the external field threshold, providing an external magnetic tamper alert.

7. The method of claim 1, wherein the register removal tamper alert is only provided upon determining that the measured magnetic field is below a removal threshold in at least two of the x-axis, the y-axis, and the z-axis.

8. The method of claim 1, wherein subsequent to providing a register removal tamper alert, the method further comprises the steps of deactivating the removal detector.

9. A solid-state register for use in a meter comprising a rotating magnet, the solid-state register comprising:
   a removal detector comprising a three-axis magnetometer and configured to measure a magnetic field in an x-axis, a y-axis, and a z-axis created by the rotating magnet; and
   a microcontroller connected to the removal detector, the microcontroller configured to
      determine whether the measured magnetic field is below a removal threshold in at least one of the x-axis, the y-axis, or the z-axis, wherein the measured magnetic field being below the removal threshold indicates removing the removal detector from the magnetic field of the rotating magnet; and
      upon determining that the magnetic field is below the removal threshold, provide a register removal tamper alert.

10. The solid-state register of claim 9, further comprising a display connected to the microcontroller and wherein the microcontroller is further configured to provide a signal to the display to display a message indicating a register removal tamper.

11. The solid-state register of claim 9, further comprising an interface connected to the microcontroller and wherein the microcontroller is further configured to provide a signal to the interface to include a flag in an automatic meter reading message indicating a register removal tamper.

12. The solid-state register of claim 11, further comprising a display connected to the microcontroller and wherein the microcontroller is further configured to provide a signal to the display to display a message indicating a register removal tamper.

13. The solid-state register of claim 9, further comprising:
   an external field detection sensor connected to the microcontroller, the external field detection sensor configured to
      measure an external magnetic field created by a magnet external to the meter; and
      determine whether the external magnetic field is above an external field threshold; and
   wherein the microcontroller is further configured to, upon determining by the external field detection sensor that the external magnetic field is above the external field threshold, provide an external magnetic tamper alert.

14. The solid-state register of claim 9, wherein the register removal tamper alert is only provided upon determining that the measured magnetic field is below a removal threshold in at least two of the x-axis, the y-axis, and the z-axis.

15. The solid-state register of claim 9, the microcontroller is further configured to deactivate the removal detector.

16. A system comprising:
   a measuring chamber of a meter assembly, the measuring chamber including a rotating magnet; and
   a solid-state register implemented in the meter assembly, the solid-state register comprising:
      a removal detector comprising a three-axis magnetometer and positioned proximate to the rotating magnet, the removal detector configured to measure a magnetic field in an x-axis, a y-axis, and a z-axis created by the rotating magnet; and
      a microcontroller connected to the removal detector, the microcontroller configured to
         determine whether the measured magnetic field is below a removal threshold in at least one of the x-axis, the y-axis, or the z-axis; and
         upon determining that the magnetic field is below the removal threshold, provide a register removal tamper alert.

17. The system of claim 16, wherein the solid-state register further comprises a display connected to the microcontroller and wherein the microcontroller is further configured to provide a signal to the display to display a message indicating a register removal tamper.

18. The system of claim 16, wherein the solid-state register further comprises:
   an external field detection sensor connected to the microcontroller, the external field detection sensor configured to
      measure an external magnetic field created by a magnet external to the meter assembly; and
      determine whether the external magnetic field is above an external field threshold; and
   wherein the microcontroller is further configured to, upon determining by the external field detection sensor that the external magnetic field is above the external field threshold, provide an external magnetic tamper alert.

19. The system of claim 16, wherein the register removal tamper alert is only provided upon determining that the measured magnetic field is below a removal threshold in at least two of the x-axis, the y-axis, and the z-axis.

20. The system of claim 16, wherein the microcontroller is further configured to deactivate the removal detector.

* * * * *